(12) United States Patent
Zhang et al.

(10) Patent No.: US 9,984,919 B1
(45) Date of Patent: May 29, 2018

(54) INVERTED DAMASCENE INTERCONNECT STRUCTURES

(71) Applicant: GLOBALFOUNDRIES Inc., Grand Cayman (KY)

(72) Inventors: Xunyuan Zhang, Troy, NY (US); Chanro Park, Clifton Park, NY (US); Yongan Xu, Albany, NY (US); Peng Xu, Guilderland, NY (US); Yann Mignot, Slingerlands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/664,584

(22) Filed: Jul. 31, 2017

(51) Int. Cl.
| | |
|---|---|
| *H01L 21/768* | (2006.01) |
| *H01L 23/522* | (2006.01) |
| *H01L 23/528* | (2006.01) |
| *H01L 23/532* | (2006.01) |

(52) U.S. Cl.
CPC .. *H01L 21/76807* (2013.01); *H01L 21/76813* (2013.01); *H01L 21/76831* (2013.01); *H01L 21/76877* (2013.01); *H01L 21/76885* (2013.01); *H01L 23/528* (2013.01); *H01L 23/5226* (2013.01); *H01L 23/53228* (2013.01)

(58) Field of Classification Search
CPC ......... H01L 21/76807; H01L 21/76813; H01L 21/76885; H01L 45/1683; H01L 2221/1015
See application file for complete search history.

(56) References Cited

U.S. PATENT DOCUMENTS

| | | | |
|---|---|---|---|
| 4,822,749 A | 4/1989 | Flanner et al. | |
| 6,399,512 B1 | 6/2002 | Blosse et al. | |
| 9,190,323 B2 * | 11/2015 | Zhang | H01L 23/53238 |
| 9,570,394 B1 | 2/2017 | Zhang et al. | |
| 2001/0055872 A1 * | 12/2001 | Fukazawa | H01L 21/76807 438/622 |
| 2004/0127001 A1 | 7/2004 | Colburn et al. | |
| 2011/0212616 A1 | 9/2011 | Seidel et al. | |
| 2016/0111329 A1 * | 4/2016 | Zhang | H01L 21/32139 257/770 |

* cited by examiner

*Primary Examiner* — Phat X Cao
(74) *Attorney, Agent, or Firm* — Thompson Hine LLP; Anthony Canale (57) ABSTRACT

Interconnect structures and methods of fabricating an interconnect structure. A first section of a mandrel is covered with a feature of an etch mask. A top surface of a second section of the mandrel is exposed by the feature of the etch mask and is recessed with an etching process. A conductive via is formed that reproduces a shape of the first section of the mandrel, and a conductive line is formed that reproduces a shape of the second section of the mandrel. The mandrel is removed to release the conductive via and the conductive line.

17 Claims, 10 Drawing Sheets

INVERTED DAMASCENE INTERCONNECT STRUCTURES

BACKGROUND

The present invention relates to integrated circuits and semiconductor device fabrication and, more specifically, to interconnect structures and methods of fabricating an interconnect structure.

A back-end-of-line (BEOL) interconnect structure may be used to connect device structures fabricated on a substrate during front-end-of-line (FEOL) processing with each other and with the environment external to the chip. A method of forming a BEOL interconnect structure is a damascene process in which via openings and trenches etched in one or more dielectric layers are filled with metal to create multi-level, high density metal interconnections. For example, in a dual-damascene process, the trenches and via openings are filled with metal using a single blanket deposition followed by planarization. The damascene processes used in forming BEOL interconnect structures face challenges as the dimensions of devices and associated interconnects shrink. One of these challenges is the inability to accurately overlay the different patterns for the trenches and via openings.

Improved interconnect structures and methods of fabricating an interconnect structure are needed.

SUMMARY

In an embodiment of the invention, a method is provided of forming an interconnect structure. The method includes forming a mandrel, covering a first section of the mandrel with a feature of an etch mask, and recessing a top surface of a second section of the mandrel that is exposed by the feature of the etch mask. The method further includes forming a conductive via that reproduces a shape of the first section of the mandrel and a conductive line that reproduces a shape of the second section of the mandrel. The mandrel is removed to release the conductive via and the conductive line.

In an embodiment of the invention, an inverted damascene interconnect structure includes a first conductive line having a top surface, and a conductive via arranged to project vertically from the top surface of the conductive line.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 4B is a top view in which FIG. 4 is taken generally along line 4-4 and FIG. 4A is taken generally along line 4A-4A.

FIG. 7C is a top view in which FIG. 7 is taken generally along line 7-7 and FIG. 7A is taken generally along line 7A-7A.

FIG. 9C is a top view in which FIG. 9 is taken generally along line 9-9 and FIG. 9A is taken generally along line 9A-9A.

DETAILED DESCRIPTION

Figure 1:
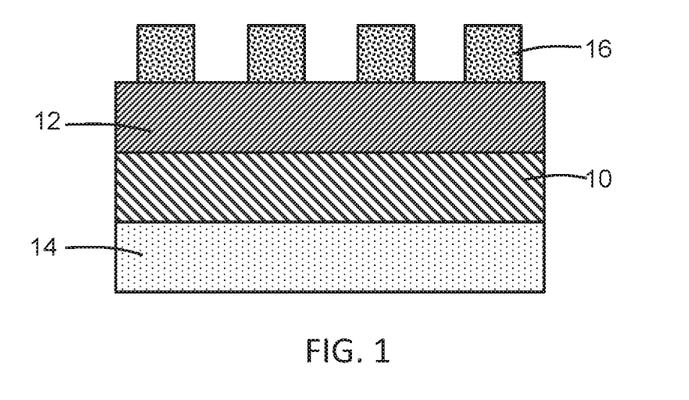
FIGS. 1-4 are cross-sectional views of a structure at successive fabrication stages of a processing method in accordance with embodiments of the invention.

With reference to FIG. 1 and in accordance with embodiments of the invention, a mandrel layer 12 is formed on a dielectric layer 10. The dielectric layer 10 may be composed of an electrically-insulating dielectric material, such as silicon oxycarbide (SiCO) or another type of low-k dielectric material. The dielectric layer 10 may be located on a substrate 14, which may be a metallization level of an interconnect structure. The mandrel layer 12 may be composed of a conductor, such as copper (Cu), or a semiconductor, such as silicon (Si).

An etch mask 16 is formed on the top surface of the mandrel layer 12. The material of the etch mask 16 is chosen to exhibit etch selectivity to the material of the mandrel layer 12. As used herein, the term "selective" in reference to a material removal process (e.g., etching) denotes that the material removal rate (i.e., etch rate) for the targeted material is higher than the material removal rate (i.e., etch rate) for at least another material exposed to the material removal process. For example, if the mandrel layer 12 is composed of silicon, the etch mask 16 may be composed of a spin-on hardmask, such as an organic planarization layer (OPL), applied as a layer by spin coating and patterned. As another example, if the mandrel layer 12 is composed of copper, the etch mask 16 may be a hardmask composed of a dielectric material, such as silicon dioxide (SiO$_2$), deposited as a layer and patterned. The etch mask 16 may be formed by two color printing involving separate exposures and etchings of independent patterns in its material using different photoresist coatings. Alternatively, the etch mask 16 may be formed by a sidewall image technique (SIT).

Figure 2:
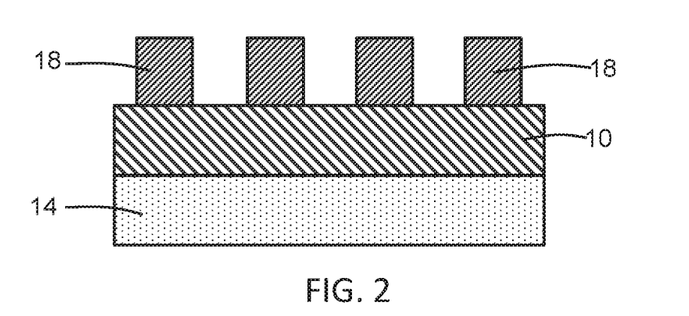

With reference to FIG. 2 in which like reference numerals refer to like features in FIG. 1 and at a subsequent fabrication stage of the processing method, the mandrel layer 12 is patterned with an etching process to form mandrels 18 over areas masked by the etch mask 16. For example, if the mandrel layer 12 is composed of copper, the mandrels 18 may be patterned with the assistance of a reactive ion etching process that uses an etch chemistry of carbon monoxide and ammonia, which etches copper with a high selectivity to a dielectric hardmask serving as the etch mask 16. The mandrels 18 have a height nominally equal to the thickness of the mandrel layer 12, and may be a set of lines having a parallel arrangement with adjacent lines separated by spaces over which the dielectric layer 10 is exposed.

Figure 3:
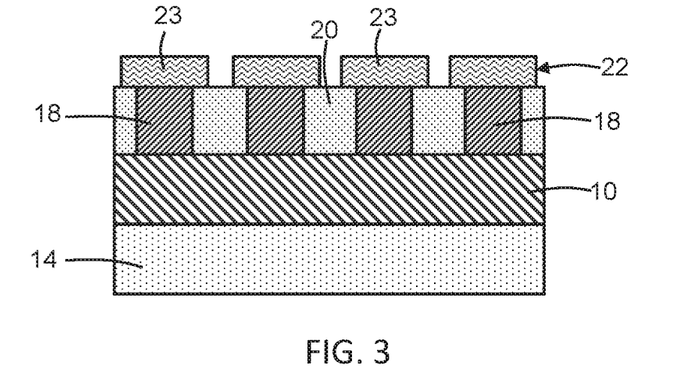

With reference to FIG. 3 in which like reference numerals refer to like features in FIG. 2 and at a subsequent fabrication stage of the processing method, a gap-fill layer 20 is applied that fills the spaces between the mandrels 18 such that the top surface of the dielectric layer 10 is completely covered. The gap-fill layer 20 may be composed of a dielectric material, such as silicon nitride ($Si_3N_4$), deposited by chemical vapor deposition and planarized with chemical mechanical polishing (CMP) to establish a planar top surface that is coplanar with a top surface of the mandrels 18.

An etch mask 22 is formed on the gap-fill layer 20. The etch mask 22 includes a set of features 23 that cover discrete areas of the mandrels 18 and that overlap with the top surface of the gap-fill layer 20 in the adjacent spaces at the side surfaces of the mandrels 18. Areas along the respective lengths of the mandrels 18 on both sides of the features 23 of the etch mask 22 are exposed such that the exposed areas of the mandrels 18 can be modified selective to the areas of the mandrels 18 covered by the etch mask 22. The features 23 of the etch mask 22 are self-aligned to the mandrels 18 in the x-direction (i.e., a direction parallel to the width of the mandrels 18) and in the y-direction (i.e., a direction parallel to the length of the mandrels 18).

The etch mask 22 may be composed of a material with which the material of the mandrels 18 exhibits etch selectivity. If the mandrels 18 are composed of silicon, the etch mask 22 may be composed of a spin-on hardmask, such as an organic planarization layer (OPL), applied by spin coating and patterned. If the mandrels 18 are composed of copper, the etch mask 22 may be composed of a hardmask composed of a dielectric material, such as silicon dioxide ($SiO_2$), deposited and patterned. The etch mask 22 may be formed by two color printing or, alternatively, may be formed by SIT.

Figure 4:
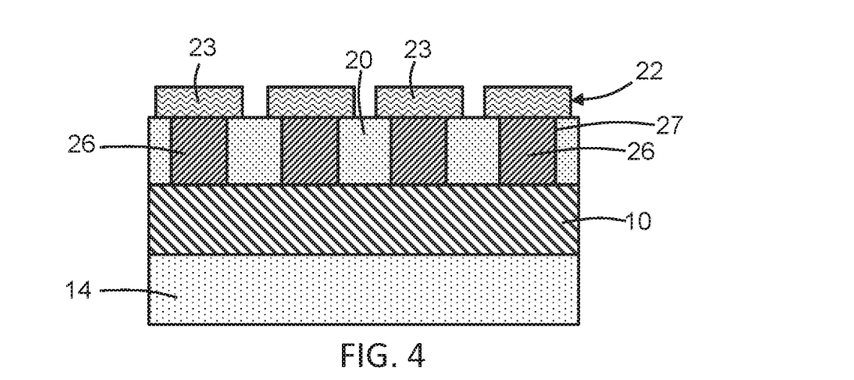
Figure 4A:
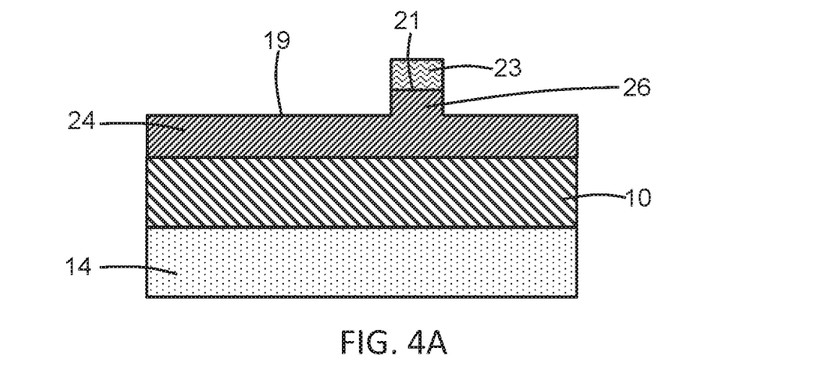
FIG. 4A is a cross-sectional view taken generally along line 4A-4A in FIG. 4B.
Figure 4B:
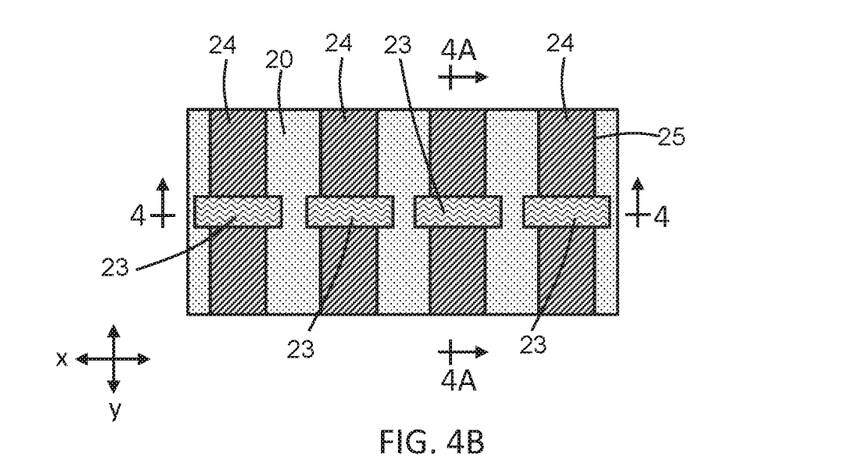

With reference to FIGS. 4, 4A, 4B in which like reference numerals refer to like features in FIG. 3 and at a subsequent fabrication stage of the processing method, the mandrels 18 are converted into sacrificial lines 24 and sacrificial pillars 26 that have a height differential between the top surface 19 of the sacrificial lines 24 and the top surface 21 of the sacrificial pillars 26. To that end, an etching process is performed that that recesses a portion of the top surface of the mandrels 18 relative to the gap-fill layer 20 over the areas along the length of the mandrels 18 that are not covered or masked by the features 23 of the etch mask 22. At the locations of the features 23 of the etch mask 22, the sacrificial pillars 26 are formed because the top surface of the mandrels 18 is masked and not recessed by the etching process. The sacrificial lines 24 are aligned with a parallel arrangement that includes gaps or spaces between adjacent pairs of sacrificial lines 24 filled by the gap-fill layer 20. The sacrificial pillars 26 project vertically from the sacrificial lines 24 and are located in a vertical direction on an opposite side of the sacrificial lines 24 from the dielectric layer 10 and the substrate 14. The sacrificial lines 24 include sidewalls 25 and the sacrificial pillars 26 include sidewalls 27 representing respective coplanar vertical surfaces.

Figure 5:
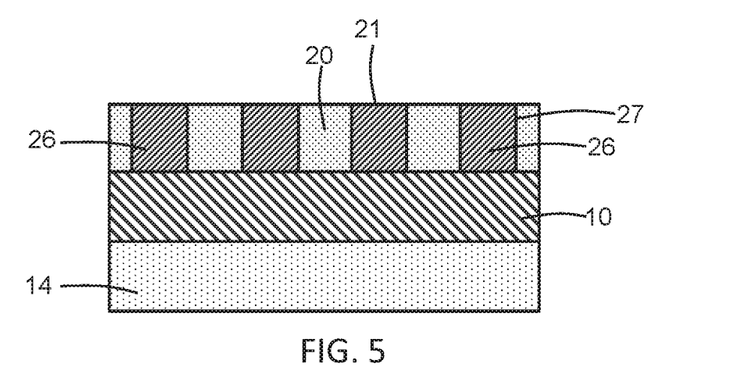
FIGS. 5 and 5A are cross-sectional views at a fabrication stage subsequent to FIGS. 4 and 4A.
Figure 5A:
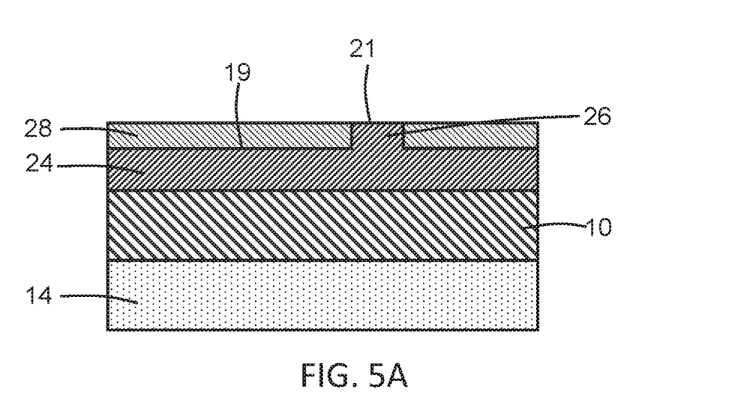

With reference to FIGS. 5, 5A in which like reference numerals refer to like features in FIGS. 4, 4A and at a subsequent fabrication stage of the processing method, the etch mask 22 is removed by stripping, and a dielectric layer 28 is deposited and planarized to be coplanar with the top surface 21 of the sacrificial pillars 26 and gap-fill layer 20.

The dielectric layer 28 may be composed of a dielectric material, such as silicon dioxide ($SiO_2$), deposited by CVD and polished with CMP to provide the planarization. Due to the lateral constraint imposed by the sections of gap-fill layer 20 flanking the sacrificial lines 24, the dielectric layer 28 filling the space above the top surface 19 of the sacrificial lines 24 has the same width as the sacrificial lines 24 and sacrificial pillars 26.

The dielectric layer 28 fills the spaces above the top surfaces 19 of the sacrificial lines 24 and between the lines of the gap-fill layer 20 to restore a planar top surface under which the sacrificial lines 24 are buried and through which a top surface of the sacrificial pillars 26 is exposed. The dielectric material of the dielectric layer 28 is selected such that the gap-fill layer 20 can be selectively removed relative to the material constituting the dielectric layer 28 and selectively removed relative to the material constituting the sacrificial lines 24 and sacrificial pillars 26.

Figure 6:
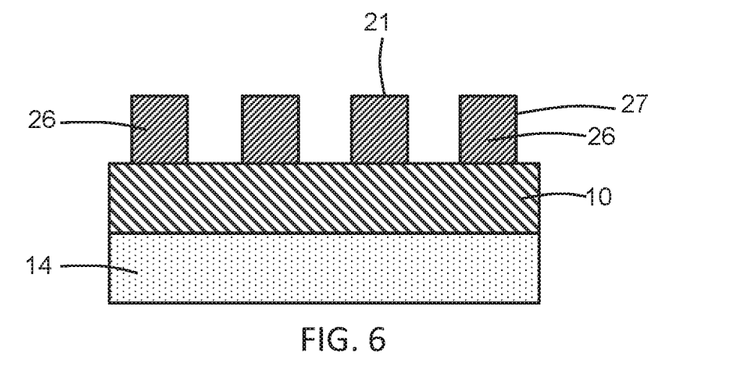
FIGS. 6 and 6A are cross-sectional views at a fabrication stage subsequent to FIGS. 5 and 5A.
Figure 6A:
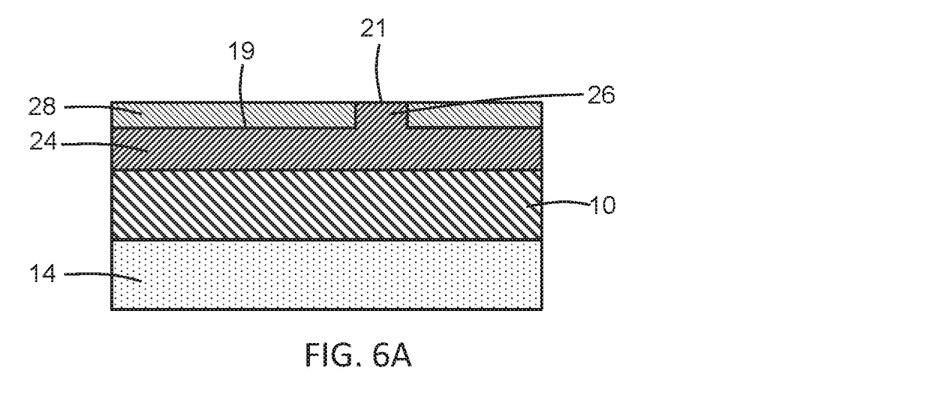
Figure 7:
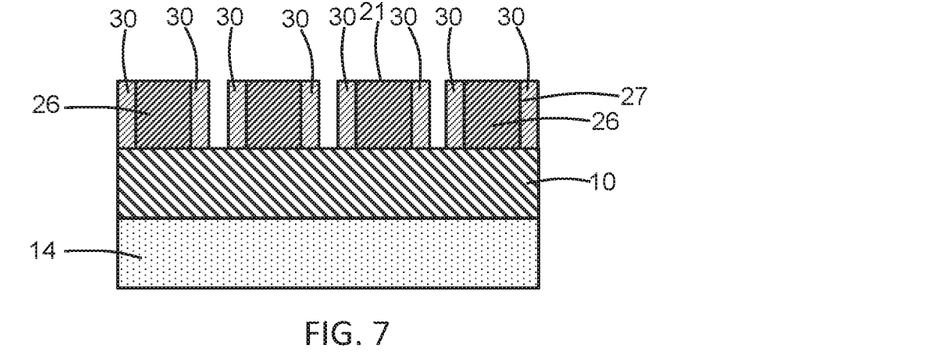
FIGS. 7 and 7A are cross-sectional views at a fabrication stage subsequent to FIGS. 6 and 6A.
Figure 7A:
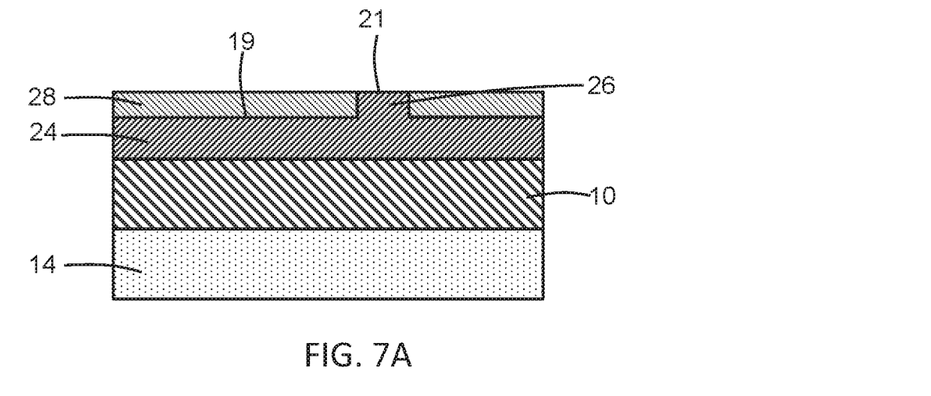
Figure 7B:
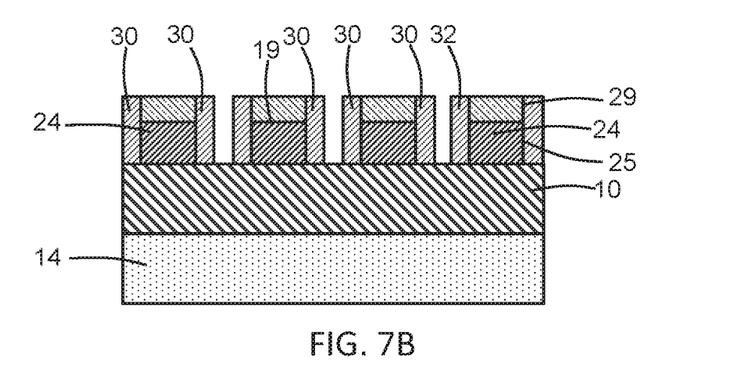
FIG. 7B is a cross-sectional view taken generally along line 7B-7B in FIG. 7C.
Figure 7C:
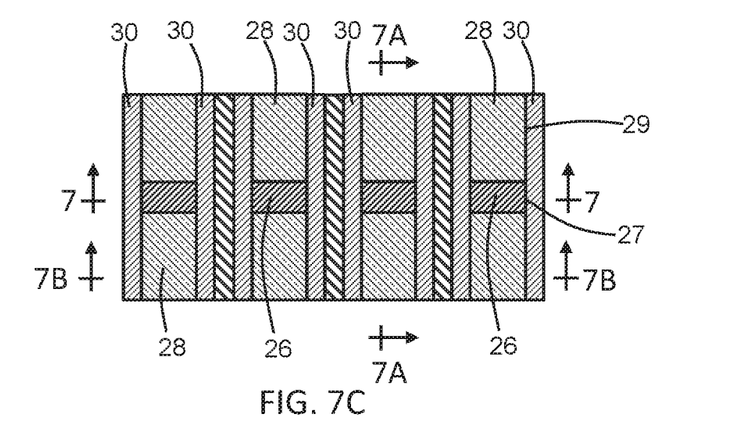

With reference to FIGS. 6, 6A in which like reference numerals refer to like features in FIGS. 5, 5A and at a subsequent fabrication stage of the processing method, the gap-fill layer 20 is removed by an etching process selective to dielectric materials of the dielectric layer 28 and dielectric layer 10. For example, the etching process may remove silicon nitride constituting gap-fill layer 20 selective to silicon dioxide constituting the dielectric layer 28. The removal of the gap-fill layer 20 re-exposes the spaces between the sacrificial lines 24 and reveals areas of the top surface of the dielectric layer 10 over those spaces. The dielectric layer 28 masks the sacrificial lines 24 and sacrificial pillars 26 with the top surfaces of the sacrificial pillars 26 still exposed through the dielectric layer 28.

With reference to FIGS. 7, 7A, 7B, 7C in which like reference numerals refer to like features in FIGS. 6, 6A and at a subsequent fabrication stage of the processing method, sidewall spacers 30 are formed on the top surface of dielectric layer 10 at locations adjacent to the sidewalls 25 of the sacrificial lines 24, the sidewalls 27 of sacrificial pillars 26, and the sidewalls 29 of dielectric layer 28. The sidewalls 25, 27, 29, which represent vertical surfaces having a coplanar arrangement, are covered by the spacers 30, which have the same height as the collective height of the sidewalls 25, 27, 29. The sidewall spacers 30 may be formed by sidewall image transfer (SIT) that includes depositing a conformal layer that covers all surfaces of the sacrificial lines 24, sacrificial pillars 26, and dielectric layer 28 and also covers the top surface of dielectric layer 10 where exposed by the sacrificial lines 24, and shaping the conformal layer with an anisotropic etching process, such as reactive ion etching (RIE). The sidewall spacers 30 are composed of a metal, such as ruthenium (Ru) or rhodium (Rh), deposited by atomic layer deposition (ALD). The materials constituting the sidewall spacers 30 is selected such that the sacrificial lines 24 and sacrificial pillars 26 (e.g., composed of copper (Cu) or silicon (Si)) can be removed selective to the material of the sidewall spacers 30 (e.g., ruthenium (Ru) or rhodium (Rh)) through the use of a suitable etch chemistry.

Figure 8:
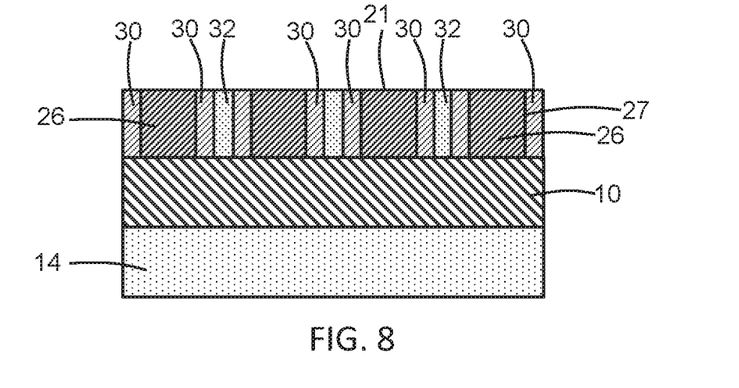
FIGS. 8 and 8A are cross-sectional views at a fabrication stage subsequent to FIGS. 7 and 7A.
Figure 8A:
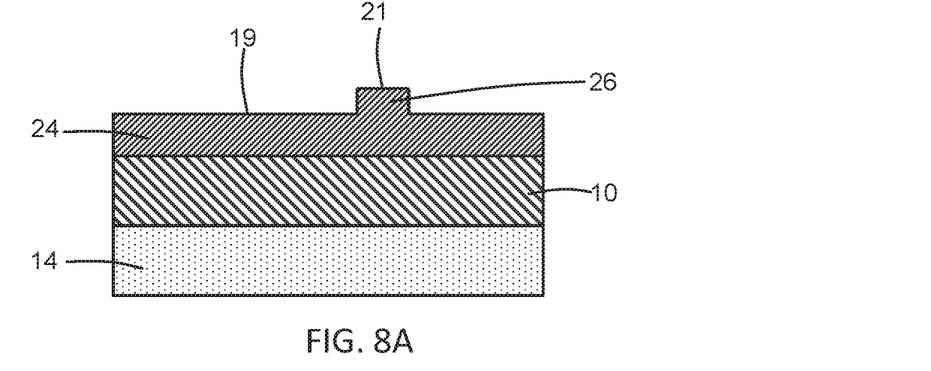

With reference to FIGS. 8, 8A in which like reference numerals refer to like features in FIGS. 7, 7A, 7B, 7C and at a subsequent fabrication stage of the processing method, the gaps between the sidewall spacers 30 may be filled with a dielectric layer 32 composed of, for example, silicon nitride ($Si_3N_4$) that is deposited and planarized with CMP to restore a planar top surface. The dielectric layer 28 is then removed from the sacrificial lines 24 selective to the materials of the sacrificial lines 24, sidewall spacers 30, and dielectric layer 32 with an etching process. After removal of dielectric layer 28, the top surfaces 19 of the sacrificial lines 24 are respectively exposed between adjacent pairs of the sidewall spacers 30.

Figure 9:
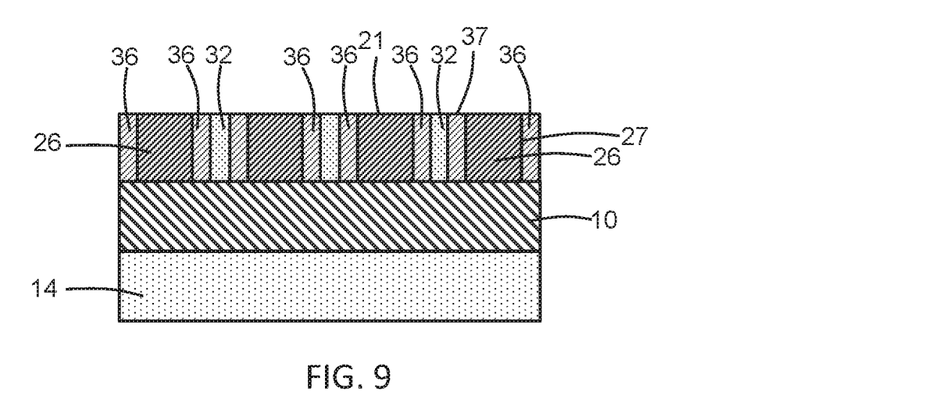
FIGS. 9 and 9A are cross-sectional views at a fabrication stage subsequent to FIGS. 8 and 8A.
Figure 9A:
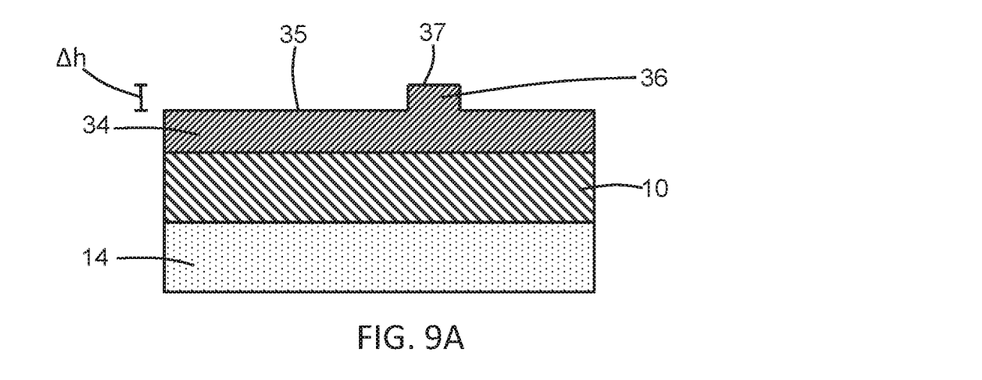
Figure 9B:
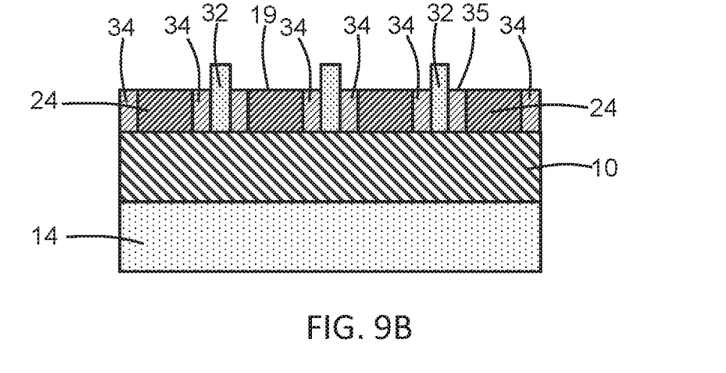
FIG. 9B is a cross-sectional view taken generally along line 9B-9B in FIG. 9C.
Figure 9C:
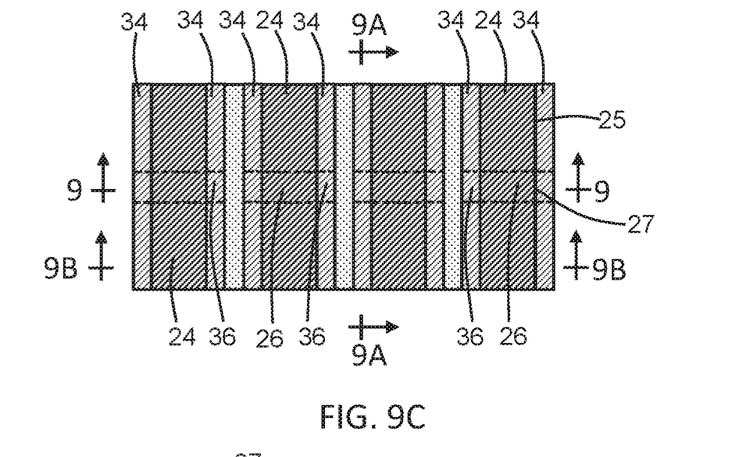

With reference to FIGS. 9, 9A, 9B in which like reference numerals refer to like features in FIGS. 8, 8A, 8B and at a subsequent fabrication stage of the processing method, portions of the sidewall spacers 30 are removed above the top surface 19 of the sacrificial lines 24 with an etching process. The remaining portions of the sidewall spacers 30 define lines 34 where etched and pillars 36 that project from the lines in a vertical direction. The etch chemistry of the etching process is selected to remove the material of the sidewall spacers 30 selective to the material constituting the dielectric layer 32 and the material constituting the sacrificial lines 24 and sacrificial pillars 26. In an embodiment, the etching process may slightly shorten the height of the pillars 36.

Following the etching process, the lines 34 and pillars 36 have the same geometrical shape as the sacrificial lines 24 and sacrificial pillars 26. More specifically, the outline or perimeter of the lines 34 is identical to the outline or perimeter of the outside edges of the sacrificial lines 24, and the outline or perimeter of the pillars 36 may be identical to the outline of perimeter of the outside edges of the sacrificial pillars 26. The respective perimeters of the lines 34 and pillars 36 intersect and merge to provide an integral construction. The pillars 36 are aligned in a vertical direction with the lines 34, and the vertical alignment is provided by the sacrificial lines 24 and sacrificial pillars 26. The width of the lines 34 and pillars 36 is controlled through the deposition process forming the sidewall spacers 30.

The lines 34 have a top surface 35 that is coplanar with the top surface 19 of the sacrificial lines 24, and pillars 36 have a top surface 37 that is coplanar with the top surface 21 of the sacrificial pillars 26. The top surfaces 35, 37 have a height difference, $\Delta h$, which may be equal to the height difference between the top surface 19 of the sacrificial lines 24 and the top surface 21 of the sacrificial pillars 26. The lines 34 are arranged between the sacrificial lines 24 and the dielectric layer 32, and the pillars 36 are arranged between the sacrificial pillars 26 and the dielectric layer 32. The lines 34 have a parallel arrangement established by the parallel arrangement of the sacrificial lines 24 and the pillars 36 project vertically from the lines 34 at the former locations of the sacrificial pillars 26.

Figure 10:
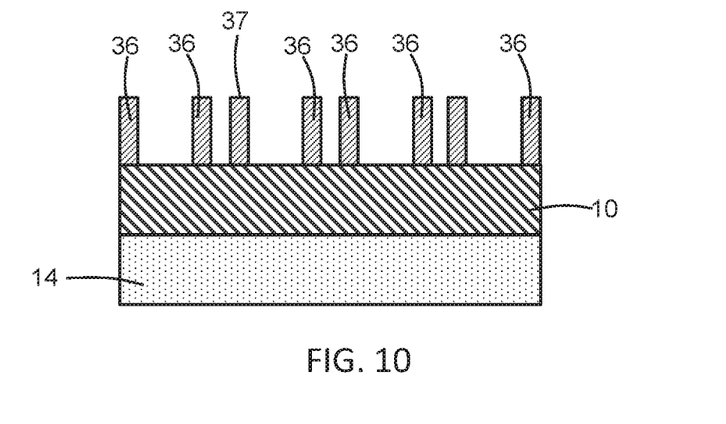
FIGS. 10, 10A, and 10B are cross-sectional views at a fabrication stage subsequent to FIGS. 9, 9A, and 9B.
Figure 10A:
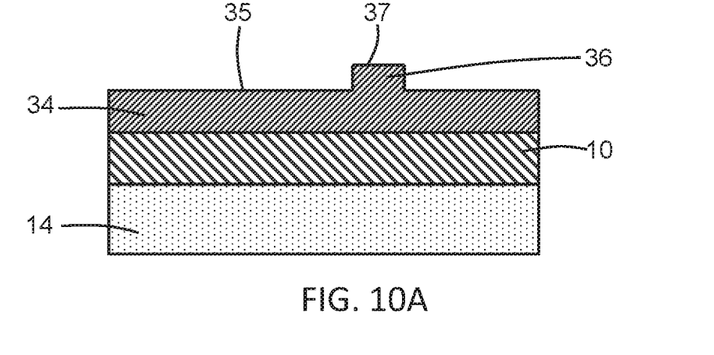
Figure 10B:
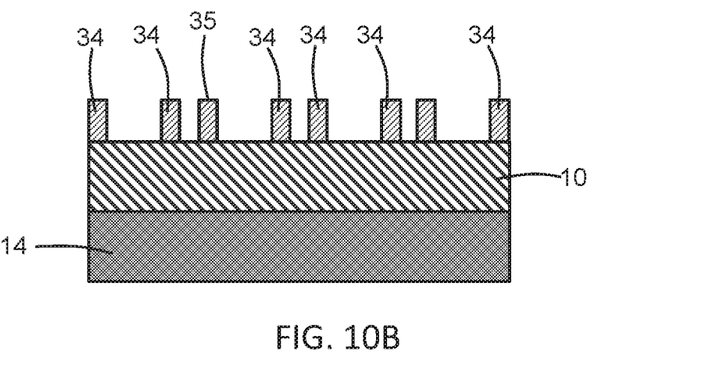

With reference to FIGS. 10, 10A, 10B in which like reference numerals refer to like features in FIGS. 9, 9A, 9B and at a subsequent fabrication stage of the processing method, the sacrificial lines 24, the sacrificial pillars 26, and the dielectric layer 32 are removed selective to the material of the lines 34 and pillars 36 with one or more etching processes of suitable etch chemistries. The resulting structure includes the lines 34 and pillars 36 as free-standing conductive features on the top surface of the dielectric layer 10 and projecting vertically from the top surface of the dielectric layer 10.

The lines 34 and pillars 36 have an inverted damascene construction at the conclusion of this fabrication stage. The lines 34 and pillars 36 may be free of voids for feature sizes of less than or equal to 15 nanometers, which differs from conventional damascene processes that may experience the formation of voids in the metallization for feature sizes of such dimensions when narrow trenches and via openings are filled. The features 23 of the etch mask 22 define the locations of the pillars 36, and the self-alignment of the features 23 may overcome overlay issues when patterning a dielectric layer as part of a dual-damascene process. Similar to conventional interconnects formed by a dual-damascene process, the lines 34 and pillars 36 have an integral (e.g., a single piece) construction, but with an inverted arrangement and without the formation of trenches and via openings in one or more dielectric layers as a prerequisite action.

Figure 11:
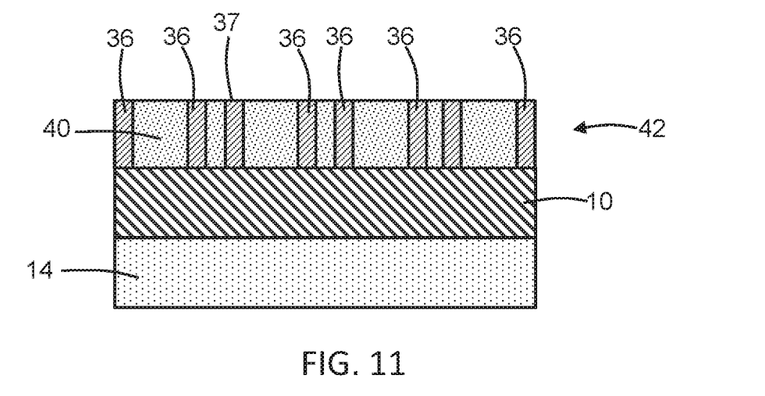
FIGS. 11, 11A, and 11B are cross-sectional views at a fabrication stage subsequent to FIGS. 10, 10A, and 10B.
Figure 11A:
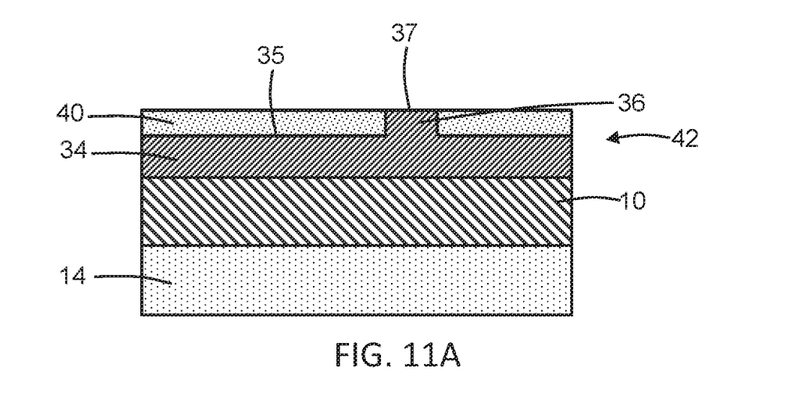
Figure 11B:
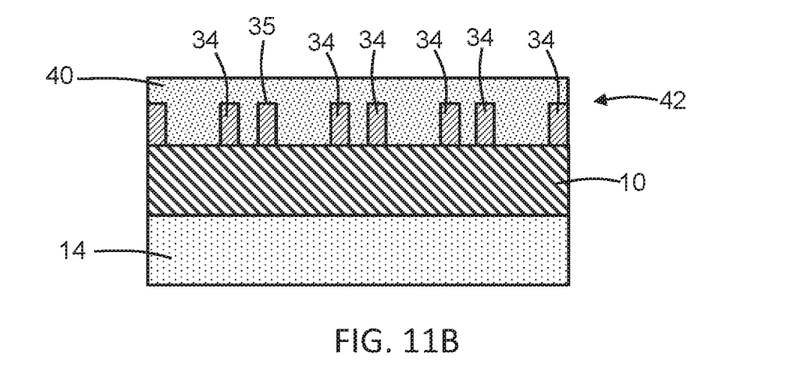

With reference to FIGS. 11, 11A, 11B in which like reference numerals refer to like features in FIGS. 10, 10A, 10B and at a subsequent fabrication stage of the processing method, a dielectric layer 40 is deposited and planarized with CMP to fill the spaces between the lines 34 and to expose the pillars 36 at the top surface of the dielectric layer 40. The lines 34, the pillars 36, and the dielectric layer 40 collectively form a metallization level 42 of an interconnect structure. The lines 34, the pillars 36, and the dielectric layer 40 are embedded in the dielectric layer 40. The metallization level 42 is inverted compared to conventional metallization levels formed by a damascene process in that the pillars 36, which serve as vias, are arranged on and project from the top surface of the lines 34. The pillars 36 are the smaller dimension features in the metallization level 42 and the lines 34 are the larger dimension features in the metallization level 42.

Figure 12:
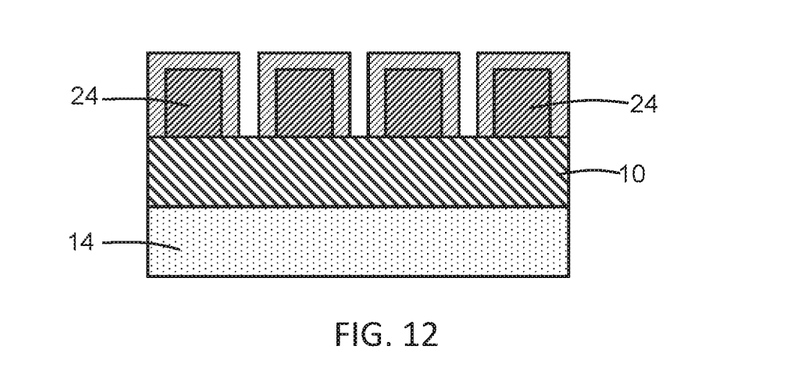
FIGS. 12 and 12A are cross-sectional views similar to FIGS. 6 and 6A at a fabrication stage of a processing method in accordance with alternative embodiments of the invention.
Figure 12A:
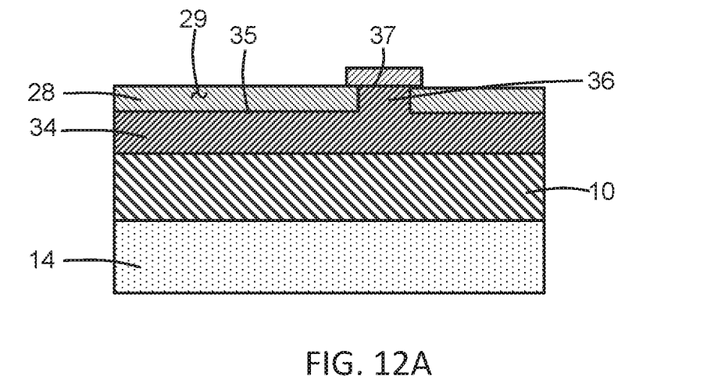

With reference to FIGS. 12, 12A in which like reference numerals refer to like features in FIGS. 6, 6A and at a subsequent fabrication stage in accordance with an alternative embodiment of the processing method, the lines 34 and pillars 36 may be formed directly on the sacrificial lines 24 and sacrificial pillars 26 without the necessity of forming the sidewall spacers 30 and the subsequent etch that recesses portions of the sidewall spacers 30 to define the lines 34 and pillars 36. Specifically, the conductor may be selectively deposited such that the conductor nucleates and deposits only the sidewalls 25 of the sacrificial lines 24 and the sidewalls 27 of the sacrificial pillars 26, but fails to nucleate and deposit on the surfaces of non-metal objects, such as the sidewalls 29 of the dielectric layer 28.

The sacrificial lines 24 and sacrificial pillars 26 provide a shape and growth template for the selective area deposition (SAD) of the conductor forming the lines 34 and pillars 36. In this instance, the template is arranged relative to the substrate 14 in a plane with a vertical orientation to the horizontal plane of the substrate 14. The outline or perimeter of the lines 34 is identical to the outline or perimeter of the outside edges of the sacrificial lines 24, and the outline or perimeter of the pillars 36 may be identical to the outline of perimeter of the outside edges of the sacrificial pillars 26. The respective perimeters of the lines 34 and pillars 36 intersect and merge to provide an integral construction.

The sacrificial lines 24 and sacrificial pillars 26 may be composed of a metal, such as tungsten (W), and the lines 34 and pillars 36 may be composed of a metal deposited by low-temperature CVD or by atomic layer deposition (ALD). In an embodiment, the lines 34 and pillars 36 may be composed of ruthenium (Ru) formed by CVD or ALD using a volatile metal precursor of ruthenium. In an embodiment, the lines 34 and pillars 36 may be composed of rhodium (Rh) formed by CVD or ALD using a volatile metal precursor of rhodium. In an embodiment, the lines 34 and pillars 36 may be composed of copper (Cu) formed by electroless plating.

Figure 13:
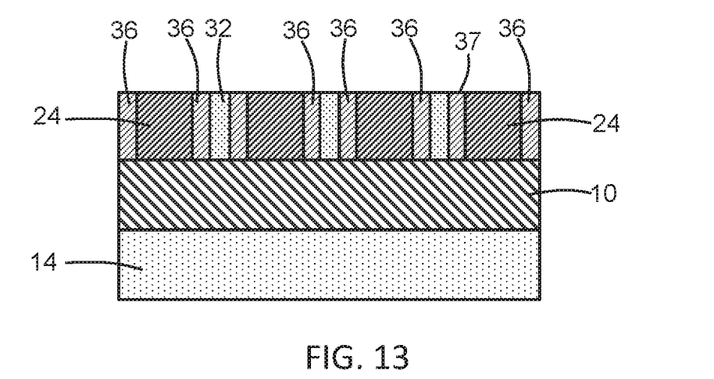
FIGS. 13 and 13A are cross-sectional views at a fabrication stage subsequent to FIGS. 12 and 12A.
Figure 13A:
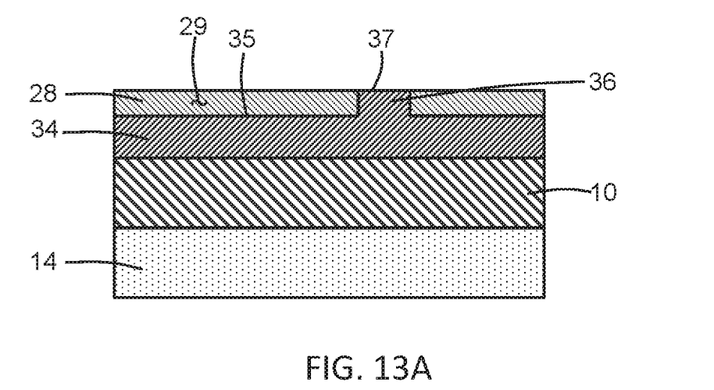

With reference to FIGS. 13, 13A in which like reference numerals refer to like features in FIGS. 12, 12A and at a subsequent fabrication stage, open spaces are filled with the dielectric layer 32 composed of, for example, silicon nitride ($Si_3N_4$) that is deposited and planarized with CMP. The process continues by removing the dielectric layer 28, and then continuing as shown and described in FIGS. 10, 10A, 10B.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an interconnect structure, the method comprising:
    forming a first mandrel;
    covering a first section of the first mandrel with a first feature of an etch mask;
    recessing a top surface of a second section of the first mandrel that is exposed by the first feature of the etch mask;
    forming a first conductive via that reproduces a shape of the first section of the first mandrel and a first conductive line that reproduces a shape of the second section of the first mandrel; and
    removing the first mandrel to release the first conductive via and the first conductive line.

2. The method of claim 1 wherein forming the first conductive via that reproduces the shape of the first section of the first mandrel and the first conductive line that reproduces the shape of the second section of the first mandrel comprises:
    after recessing the top surface of the second section of the first mandrel, forming a dielectric layer on a top surface of the second section of the first mandrel; and
    selectively depositing a conductor on a sidewall collectively defined by the first section of the first mandrel and the second section of the first mandrel.

3. The method of claim 2 wherein the first mandrel is composed of tungsten, and the conductor is composed of ruthenium, rhodium, or copper.

4. The method of claim 1 wherein forming the first conductive via that reproduces the shape of the first section of the first mandrel and the first conductive line that reproduces the shape of the second section of the first mandrel comprises:
    after recessing the top surface of the second section of the first mandrel, forming a dielectric layer on a top surface of the second section of the first mandrel; and
    forming a sidewall spacer composed of a conductor adjacent to a sidewall collectively defined by the first section of the first mandrel, the second section of the first mandrel, and the dielectric layer.

5. The method of claim 4 wherein forming the first conductive via that reproduces the shape of the first section of the first mandrel and the first conductive line that reproduces the shape of the second section of the first mandrel further comprises:
    after forming the sidewall spacer, removing the dielectric layer to expose portions of the sidewall spacer located above the top surface of the second section of the first mandrel; and
    removing the exposed portions of the sidewall spacer to define the first conductive via and the first conductive line.

6. The method of claim 4 wherein the first mandrel is composed of silicon or copper, and the conductor is composed of ruthenium or rhodium.

7. The method of claim 1 further comprising:
    after removing the first mandrel, depositing a dielectric layer that covers the first conductive line and the first conductive via; and
    planarizing the dielectric layer to be coplanar with a top surface of the first conductive via.

8. The method of claim 1 wherein forming the first mandrel further comprises:
    depositing a mandrel layer; and
    patterning the mandrel layer to form the first mandrel;
    wherein the etch mask is applied after patterning the mandrel layer.

9. The method of claim 8 wherein the mandrel layer is deposited on a dielectric layer, and the first conductive line is arranged vertically between the first conductive via and the dielectric layer.

10. The method of claim 1 wherein the first mandrel is formed on a dielectric layer, and the first conductive line is arranged vertically between the first conductive via and the dielectric layer.

11. The method of claim 1 further comprising:
    forming a second mandrel;
    covering a first section of the second mandrel with a second feature of the etch mask;
    recessing a top surface of a second section of the second mandrel that is exposed by the etch mask;
    forming a second conductive via that reproduces a shape of the first section of the second mandrel and a second conductive line that reproduces a shape of the second section of the second mandrel; and removing the second mandrel to release the second conductive via and the second conductive line.

12. The method of claim 11 wherein the first feature of the etch mask is aligned with the second feature of the etch mask in a first direction and in a second direction transverse to the first direction.

13. The method of claim 11 wherein the second section of the first mandrel and the second section of the second mandrel are concurrently recessed.

14. The method of claim 11 wherein the first conductive via and the second conductive via are concurrently formed on a first portion of respective sidewalls of the second section of the first mandrel and the second section of the second mandrel, and the first conductive line and the second conductive line are concurrently formed on a second portion of the respective sidewalls of the second section of the first mandrel and the second section of the second mandrel.

15. The method of claim 1 wherein removing the first mandrel to release the first conductive via and the first conductive line comprises:
  removing the first mandrel selective to the first conductive via and the first conductive line.

16. The method of claim 1 wherein the first conductive line and the first conductive via are composed of ruthenium or rhodium.

17. The method of claim 1 wherein the first conductive line and the first conductive via are composed of ruthenium, rhodium, or copper.

* * * * *